US012813346B2

(12) United States Patent
Sokol et al.

(10) Patent No.: US 12,813,346 B2
(45) Date of Patent: Nov. 24, 2026

(54) MULTIPLE JUNCTION LIGHT-EMITTING DIODE CHIPS AND RELATED METHODS

(71) Applicant: CreeLED, Inc., Durham, NC (US)

(72) Inventors: Joseph G. Sokol, Durham, NC (US); Michael Check, Holly Springs, NC (US); David Suich, Durham, NC (US); Andre Pertuit, Raleigh, NC (US); Robert Wilcox, Rolesville, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 450 days.

(21) Appl. No.: 18/460,758

(22) Filed: Sep. 5, 2023

(65) Prior Publication Data

US 2025/0079409 A1 Mar. 6, 2025

(51) Int. Cl.
*H10W 90/00* (2026.01)
*H10H 20/857* (2025.01)
*H10H 20/01* (2025.01)

(52) U.S. Cl.
CPC .......... *H10W 90/00* (2026.01); *H10H 20/857* (2025.01); *H10H 20/0364* (2025.01)

(58) Field of Classification Search
CPC . H10W 90/00; H10H 20/857; H10H 20/0364; H10H 20/813
See application file for complete search history.

(56) References Cited

U.S. PATENT DOCUMENTS

| | | | | |
|---|---|---|---|---|
| 5,853,497 | A * | 12/1998 | Lillington | H10F 10/142 257/E25.007 |
| 7,737,451 | B2 | 6/2010 | Ibbetson et al. | |
| 11,538,963 | B1 * | 12/2022 | Yadavalli | H10H 20/013 |
| 11,889,709 | B2 * | 1/2024 | Forrest | H10F 10/142 |
| 12,272,682 | B2 * | 4/2025 | Li | H10H 20/856 |
| 2005/0067627 | A1 * | 3/2005 | Shen | H10H 20/813 257/89 |
| 2008/0190479 | A1 | 8/2008 | Hsieh et al. | |
| 2010/0207100 | A1 | 8/2010 | Strassburg et al. | |
| 2013/0270514 | A1 | 10/2013 | Saxler | |
| 2019/0198709 | A1 | 6/2019 | Wildeson et al. | |
| 2020/0403026 | A1 * | 12/2020 | Li | H10D 86/40 |
| 2022/0165718 | A1 | 5/2022 | Chae et al. | |
| 2023/0402437 | A1 * | 12/2023 | Jang | H10H 29/24 |
| 2024/0113150 | A1 * | 4/2024 | Cha | H10H 29/10 |

(Continued)

*Primary Examiner* — Victor A Mandala
(74) *Attorney, Agent, or Firm* — Withrow & Terranova, P.L.L.C.

(57) ABSTRACT

Semiconductor devices and more particularly multiple junction light-emitting diode (LED) chips and related methods are disclosed. LED chips include multiple active LED structures that are bonded together. The active LED structures may be vertically bonded within the LED chip. Bonding layers are provided between active LED structures with sufficient thicknesses to maintain mechanical integrity within the LED chip. Bonding layers may be formed of electrically insulating materials with electrically conductive vias formed therethrough to provide electrically conductive paths between active LED structures. Active LED structures may be connected in series for high voltage applications. Emissions from the active LED structures may have same emission colors, multiple distinct emission colors, and/or variations in peak wavelengths within a same color range.

20 Claims, 9 Drawing Sheets

(56) References Cited

U.S. PATENT DOCUMENTS

| | | | | |
|---|---|---|---|---|
| 2024/0274586 | A1* | 8/2024 | Wang | H10H 20/80 |
| 2024/0332467 | A1* | 10/2024 | Ko | H10H 20/853 |
| 2024/0355791 | A1* | 10/2024 | Cha | H10H 20/817 |

* cited by examiner

MULTIPLE JUNCTION LIGHT-EMITTING DIODE CHIPS AND RELATED METHODS

FIELD OF THE DISCLOSURE

The present disclosure relates to semiconductor devices and more particularly to multiple junction light-emitting diode (LED) chips and related methods.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have been widely adopted in various illumination contexts, for backlighting of liquid crystal display (LCD) systems (e.g., as a substitute for cold cathode fluorescent lamps), and for direct-view LED displays. Applications utilizing LED arrays further include vehicular headlamps, roadway illumination, light fixtures, and various indoor, outdoor, and specialty contexts. Desirable characteristics of LED devices include high luminous efficacy, long lifetime, and color gamut.

LEDs convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. Multiple color LED packages have been developed that include LED chips with different emission colors arranged within a same package structure. In certain applications, the LED chips can be arranged in close proximity to one another on a common submount, which can add complexity for corresponding electrical connections. As LED applications continue to advance, challenges exist in producing high quality light with desired emission characteristics while also providing high light emission efficiency.

The art continues to seek improved LEDs and solid-state lighting devices having desirable illumination characteristics capable of overcoming challenges associated with conventional lighting devices.

SUMMARY

The present disclosure relates to semiconductor devices and more particularly to multiple junction light-emitting diode (LED) chips and related methods. LED chips include multiple active LED structures that are bonded together. The active LED structures may be vertically bonded within the LED chip. Bonding layers are provided between active LED structures with sufficient thicknesses to maintain mechanical integrity within the LED chip. Bonding layers may be formed of electrically insulating materials with electrically conductive vias formed therethrough to provide electrically conductive paths between active LED structures. Active LED structures may be connected in series for high voltage applications. Emissions from the active LED structures may have same emission colors, multiple distinct emission colors, and/or variations in peak wavelengths within a same color range.

In one aspect, an LED chip comprises: a first active LED structure comprising a first n-type layer, a first active layer, and a first p-type layer; a second active LED structure comprising a second n-type layer, a second active layer, and a second p-type layer; and a bonding layer between the first n-type layer and the second p-type layer, the bonding layer comprising a thickness of at least 100 nanometers (nm). In certain embodiments, the bonding layer comprises a thickness in a range from 100 nm to 5000 nm. In certain embodiments, the bonding layer comprises an electrically insulating material and at least one electrically conductive via, the at least one electrically conductive via forming an electrically conductive path between the first n-type layer and the second p-type layer. In certain embodiments, the at least one electrically conductive via comprises: a first sublayer with a first metal that contacts the first n-type layer; and a second sublayer with a second metal that contacts the second p-type layer, wherein the second metal is different than the first metal. In certain embodiments, the at least one electrically conductive via further comprises a third sublayer between the first sublayer and the second sublayer, and the third sublayer comprises a third metal that is different from both the first metal and the second metal. In certain embodiments, the bonding layer comprises a conductive oxide. The LED chip may further comprise an n-contact pad and a p-contact pad that are both on a same side of the first active LED structure. The LED chip may further comprise an n-contact pad and a p-contact pad, wherein the first active LED structure and the second active LED structure are between the n-contact pad and the p-contact pad. In certain embodiments, the first active LED structure and the second active LED structure are configured to provide peak wavelengths that differ in a range from 5 nanometers (nm) to 20 nm from one another. In certain embodiments, the first active LED structure and the second active LED structure are configured to provide peak wavelengths that differ in a range from 25 nm to 300 nm from one another.

In another aspect, an LED chip comprises: a first active LED structure comprising a first n-type layer, a first active layer, and a first p-type layer; a second active LED structure comprising a second n-type layer, a second active layer, and a second p-type layer; and a first bonding layer between the first n-type layer and the second p-type layer, the first bonding layer comprising at least one electrically conductive via between the first n-type layer and the second p-type layer. In certain embodiments, the at least one electrically conductive via comprises: a first sublayer with a first metal that contacts the first n-type layer; and a second sublayer with a second metal that contacts the second p-type layer, wherein the second metal is different than the first metal. In certain embodiments, the at least one electrically conductive via further comprises a third sublayer between the first sublayer and the second sublayer, and the third sublayer comprises a third metal that is different from both the first metal and the second metal. The LED chip may further comprise: a third active LED structure on the first active LED structure, the third active LED structure comprising a third n-type layer, a third active layer, and a third p-type layer; and a second bonding layer between the third n-type layer and the first p-type layer. In certain embodiments, the second bonding layer comprises another electrically conductive via between the third n-type layer and the first p-type layer.

In another aspect, a method comprises: providing a first active light-emitting diode (LED) structure comprising a first n-type layer, a first active layer, and a first p-type layer; providing a second active LED structure comprising a second n-type layer, a second active layer, and a second p-type layer; and bonding the first active LED structure to the second active LED structure with a bonding layer between the first n-type layer and the second p-type layer, the bonding layer comprising a thickness of at least 100 nanometers (nm). The method may further comprise at least one electrically conductive via in the bonding layer that forms an electrically conductive path between the first n-type layer and the second p-type layer. In certain embodiments, the first active LED structure is formed on a first growth substrate and the second active LED structure is formed on a second growth substrate. The method may further comprise removing the first growth substrate from the first active LED structure before bonding the first active LED structure to the second active LED structure. The method may further comprise bonding a third active LED structure to the first active LED structure.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
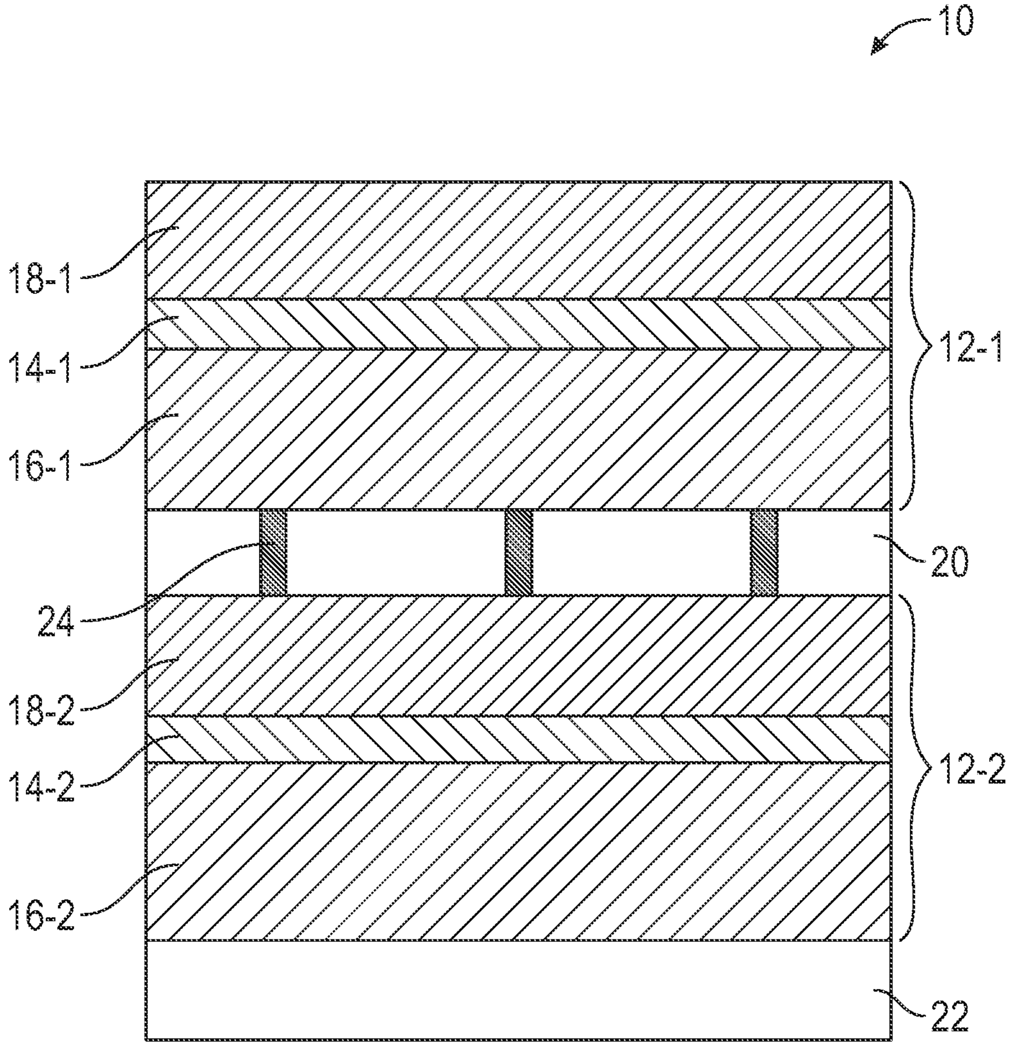
FIG. 1 is a cross-sectional view of a light-emitting diode (LED) chip with multiple active LED structures according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to semiconductor devices and more particularly to multiple junction light-emitting diode (LED) chips and related methods. LED chips include multiple active LED structures that are bonded together. The active LED structures may be vertically bonded within the LED chip. Bonding layers are provided between active LED structures with sufficient thicknesses to maintain mechanical integrity within the LED chip. Bonding layers may be formed of electrically insulating materials with electrically conductive vias formed therethrough to provide electrically conductive paths between active LED structures. Active LED structures may be connected in series for high voltage applications. Emissions from the active LED structures may have same emission colors, multiple distinct emission colors, and/or variations in peak wavelengths within a same color range.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group Ill nitrides refer to those semiconductor compounds formed between nitrogen (N) and the elements in Group Ill of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include organic semiconductor materials and other Group III-V systems such as gallium phosphide (GaP), gallium arsenide (GaAs), and related compounds. The active LED structure may be grown on a growth substrate that can include many materials, such as sapphire, silicon carbide (SIC), aluminum nitride (AlN), and GaN.

Different embodiments of the active LED structure can emit different wavelengths of light depending on the composition of the active layer and n-type and p-type layers. In some embodiments, the active LED structure emits blue light with a peak wavelength range in a range of 430 nanometers (nm) to 480 nm. In other embodiments, the active LED structure emits green light with a peak wavelength in a range of 500 nm to 570 nm. In other embodiments, the active LED structure emits orange and/or red light with a peak wavelength range of 600 nm to 700 nm. In still further embodiments, the active LED structure may emit cyan light with a peak wavelength in a range of 485 nm to 500 nm or violet light with a peak wavelength in a range from 400 nm to 420 nm. In certain embodiments, the active LED structure may be configured to emit light that is outside the visible spectrum, including one or more portions of the ultraviolet (UV) spectrum, the infrared (IR) or near-IR spectrum. The UV spectrum is typically divided into three wavelength range categories denotated with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. Near-IR and/or IR wavelengths for LED structures of the present disclosure may have wavelengths above 700 nm, such as in a range from 700 nm to 1000 nm, or more.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

In LED display applications, LED chips are typically individually addressable to provide color-changing, dynamic spectral tuning, and the like. When LED chips having different emission wavelengths are arranged in close proximity to one another, practical limitations exist for packaging the LED chips, providing electrical connections, and/or thermal management. Conventional devices for such applications may include separately packaged LED components that are clustered together, where each separately packaged LED component may include a single LED chip or a grouping of different LED chips. However, each separately packaged LED component typically includes its own submount and encapsulant, thereby providing spatial limitations in how close the separately packaged LED components may be arranged together.

According to aspects of the present disclosure, LED chips include multiple active LED structures that are bonded together. Each of the active LED structures within an exemplary LED chip form light-emitting junctions that collectively provide aggregate emissions from the LED chip when electrically activated. The active LED structures may be vertically stacked and bonded together during chip fabrication by way of one or more bonding layers. The bonding layer may have a thickness sufficient to maintain mechanical integrity within the LED chip. In certain embodiments, the bonding layer is formed of an electrically insulating material, and electrically conductive paths may be formed through the bonding layer between the active LED structures. In other embodiments, the bonding layer may embody a conductive oxide. According to principles of the present disclosure, multiple junction LED chips may be stacked on top of one another to occupy a same footprint within an LED component and/or an LED display as a single junction LED chip while advantageously providing additional light output. The additional light output may include multiple distinct emission wavelengths, such as red, green, and blue emissions, and/or the additional light output may include increased brightness from the same footprint. In other embodiments, the multiple active LED structures may emit a same or similar wavelength and the multiple junction structure provides increased brightness for a same footprint.

FIG. 1 is a cross-sectional view of an LED chip 10 with multiple active LED structures 12-1, 12-2 according to principles of the present disclosure. Each active LED structure 12-1, 12-2 respectively includes an active layer 14-1, 14-2 positioned between an n-type layer 16-1, 16-2 and a p-type layer 18-1, 18-2. As described above, the active layer 14-1, 14-2 may embody a single quantum well or a multiple quantum well structure and many other layers or sublayers may be present in each active LED structure 12-1, 12-2. In certain embodiments, the active LED structures 12-1, 12-2 are separately formed from one another and bonded together by way of a bonding layer 20. For example, first and second active LED structures 12-1, 12-2 may be formed by separate epitaxial growth sequences on different growth wafers. In FIG. 1, a substrate 22 is illustrated proximate the second active LED structure 12-2. In certain embodiments, the substrate 22 is a growth substrate that is part of the growth wafer originally used for growth of the second active LED structure 12-2. By way of example, the substrate 22 may comprise a sapphire substrate. A growth substrate for the first active LED structure 12-1 may be removed before bonding with the second active LED structure 12-2.

The bonding layer 20 may embody one or more electrically insulating materials with a thickness sufficient to maintain mechanical integrity after bonding the active LED structures 12-1, 12-2 together. In certain embodiments, a thickness of the bonding layer 20 is at least 100 nm, or in a range from 100 nm to 5000 nm, or in a range from 250 nm to 750 nm. Depending on the structure, thickness values below about 100 nm may provide insufficient bonding strength. Additionally, thicknesses below about 10 nm or below about 5 nm may promote formation of tunnel junction structures, which may be ineffective at conducting sufficient current flow for the LED chip 10. As such, the principles of the present disclosure provide thick bonding layers for maintaining mechanical integrity while also avoiding tunnel junction structures.

In certain embodiments, the bonding layer 20 may embody a transparent conductive oxide, such as indium tin oxide (ITO), zinc oxide (ZnO), molybdenum oxide ($MoO_3$), and/or tantalum oxide (TaO), among others. In other embodiments, the bonding layer 20 comprises an electrically insulating material, such as silicon dioxide ($SiO_2$) and/or silicon nitride (SiN), among others. When the bonding layer 20 is electrically insulating, electrically conductive vias 24, such as metal vias, may extend through the bonding layer 20 to electrically couple a first n-type layer 16-1 to a second p-type layer 18-2. The electrically conducive vias 24 may have thicknesses that are the same as the bonding layer 20. Diameters of the electrically conductive vias 24, as measured laterally, may be in a range from 500 nm up to about 30 microns (μm). In certain embodiments, the bonding layer 20 is light-transmissive and/or light-transparent to light emitted by the active LED structures 12-1, 12-2, thereby allowing light to freely pass therethrough. By electrically coupling the first n-type layer 16-1 to the second p-type layer 18-2, the active LED structures 12-1, 12-2 may be electrically coupled in series to provide higher voltage operation for the LED chip.

As described above, the LED chip 10 of FIG. 1 includes multiple active LED structures 12-1, 12-2 that are separately grown and bonded together. Such a sequence is advantageous over growing the multiple active LED structures 12-1, 12-2 in a same growth reactor and on a same growth substrate. When grown in a same growth reactor, epitaxial strain between the different active LED structures 12-1, 12-2 may reduce overall crystalline quality and thereby impact performance of the LED chip 10. Additionally, same reactor growth may not allow proper growth chamber conditioning between successive growths of active LED structures. In this regard, certain elements used for certain layers may still be present as contaminants in the growth chamber for successive active LED structures. For example, Mg is commonly used as a dopant for p-type layers, which are typically grown after active layers in active LED structures. During same reactor growth, the growth chamber may not be sufficiently conditioned, thereby causing Mg to inadvertently incorporate into active layers of later grown active LED structures, which contribute to leakage pathways. By separately growing the multiple active LED structures 12-1, 12-2, such strain may be avoided. Additionally, compositionally different active LED structures 12-1, 12-2 that require different growth reactors, such as GaN-based compounds for blue and/or green LED emissions and GaP and/or GaAs-based compounds for red LED emissions, may be implemented in the same LED chip 10. In this regard, the active LED structures 12-1, 12-2, and corresponding active layers 14-1, 14-2, may be configured to provide peak wavelengths that differ by at least 25 nm from one another or differ in a range from 25 nm to 300 nm from one another. In still further embodiments, the active LED structures 12-1, 12-2 may be configured to emit similar emissions colors with smaller variations in wavelength, such as variations in a peak wavelength range from 5 nm to 20 nm between each active LED structure 12-1, 12-2. Accordingly, the LED chip 10 may provide emissions, such as blue, with broader bandwidth than a single junction LED. Broader bandwidth emissions within a single color range may be beneficial for enhanced coupling and excitation of recipient lumiphoric materials for wavelength conversion. Broader bandwidth emissions may also be beneficial for providing increased color rendering and/or daylight spectrum matching for color temperatures from 5000 Kelvin (K) to 10000 K. By way of example, the active LED structure 12-1 may be configured to emit a peak wavelength of 450 nm while the active LED structure 12-2 may be configured to emit a peak wavelength of 455 nm or 460 nm.

FIGS. 2A to 2E illustrate a fabrication sequence for a multiple junction LED chip similar to the LED chip 10 of FIG. 1. While the principles described for FIG. 1 and FIGS. 2A to 2E are provided in the context of two active LED structures 12-1, 12-2, the concepts are readily scalable to any number of active LED structures that may be bonded and stacked together.

Figure 2A:
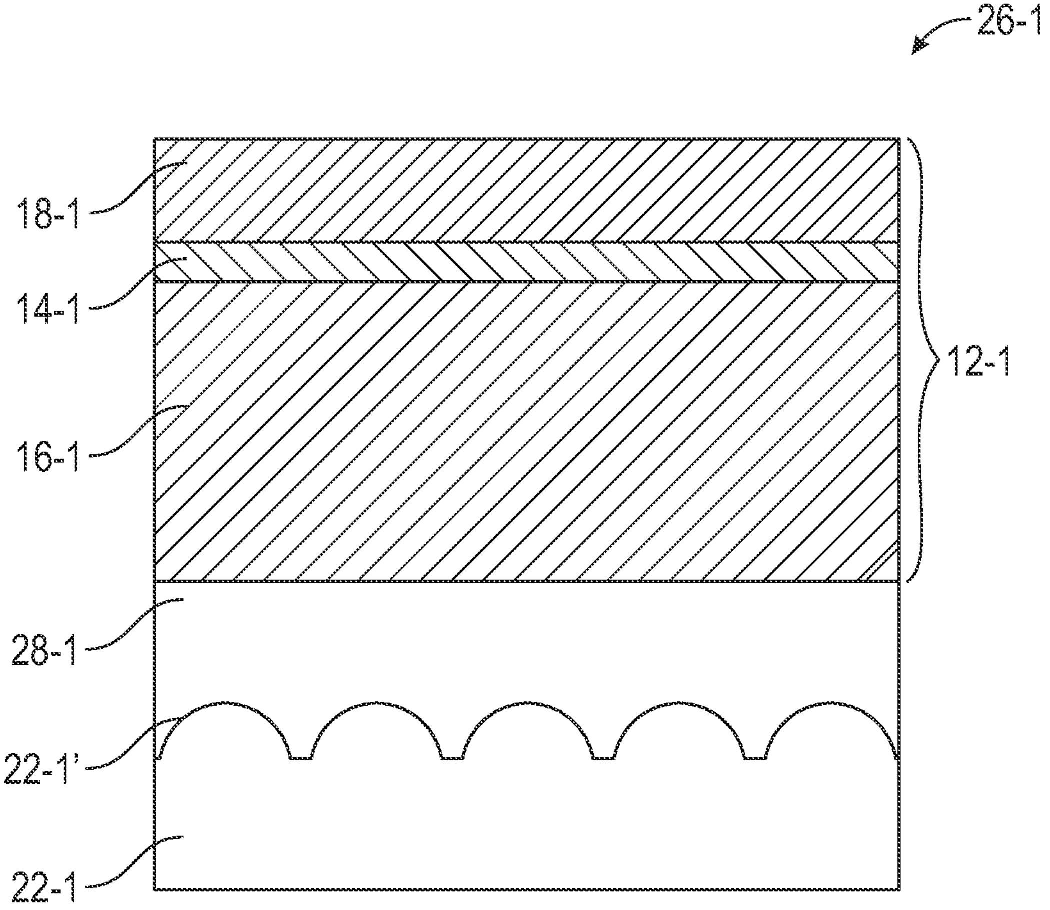
FIG. 2A is a cross-sectional view of a first LED chip with a single junction at a first fabrication step for forming a multiple junction LED chip.

FIG. 2A is a cross-sectional view of a first LED chip 26-1 with a single junction at a first fabrication step for forming a multiple junction LED chip. As illustrated, the LED chip 26-1 includes the first active LED structure 12-1 on a first substrate 22-1. The first substrate 22-1 may embody a growth substrate, such as sapphire, for the first active LED structure 12-1. In certain embodiments, one or more intermediate layers 28-1 may be arranged between the active LED structure 12-1 and the first substrate 22-1. The intermediate layer 28-1 may embody one or more undoped or doped epitaxial buffer layers and/or transition layers that provide a suitable surface away from the first substrate 22-1 to facilitate growth of the active LED structure 12-1. In certain embodiments, the first substrate 22-1 may comprise a patterned substrate with a number of patterned features 22-1' at a growth surface proximate the active LED structure 12-1 and intermediate layer 28-1.

Figure 2B:
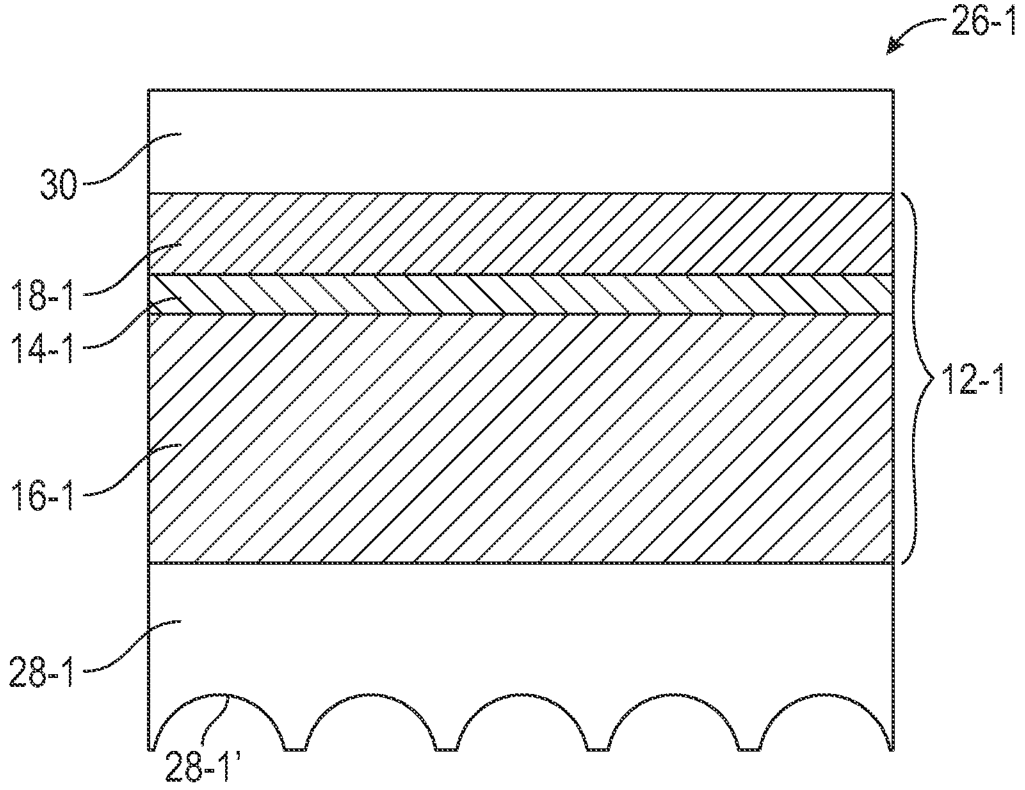
FIG. 2B is a cross-sectional view of the first LED chip of FIG. 2A at a subsequent fabrication step after a first substrate of FIG. 2A is removed.

FIG. 2B is a cross-sectional view of the LED chip 26-1 of FIG. 2A at a subsequent fabrication step after the first substrate 22-1 of FIG. 2A is removed. Many substrate removal processes may be employed, such as those that implement mechanical and/or chemical removal steps. In certain embodiments, the first substrate 22-1 may be removed by a laser lift-off process. As illustrated, the intermediate layer 28-1 may have a pattern 28-1' on a lower surface thereof after laser lift-off that corresponds with the patterned features 22-1' as illustrated in FIG. 2A. In certain embodiments, the active LED structure 12-1 may be adhered to a carrier substrate 30 to provide mechanical support during removal of the first substrate 22-1 and for later fabrication steps.

Figure 2C:
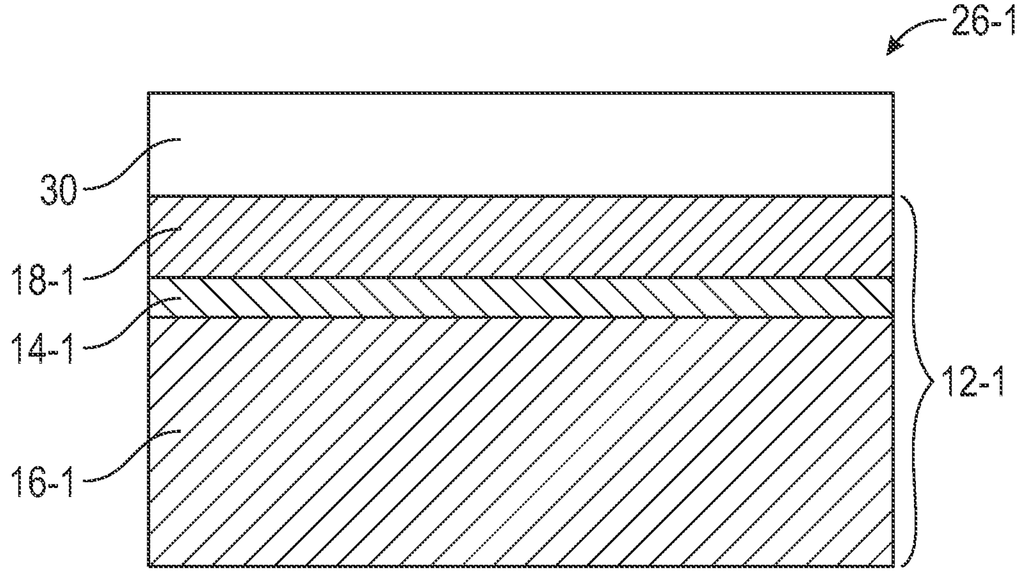
FIG. 2C is a cross-sectional view of the first LED chip of FIG. 2B at a subsequent fabrication step after removal of an intermediate layer.

FIG. 2C is a cross-sectional view of the LED chip 26-1 of FIG. 2B at a subsequent fabrication step after removal of the intermediate layer 28-1. The intermediate layer 28-1 may be removed by a smoothing process, such as polishing and/or mechanical grinding that exposes and smooths a surface of the active LED structure 12-1 to facilitate bonding at a subsequent step. As illustrated, the bottom surface of the first n-type layer 16-1 is now accessible.

Figure 2D:
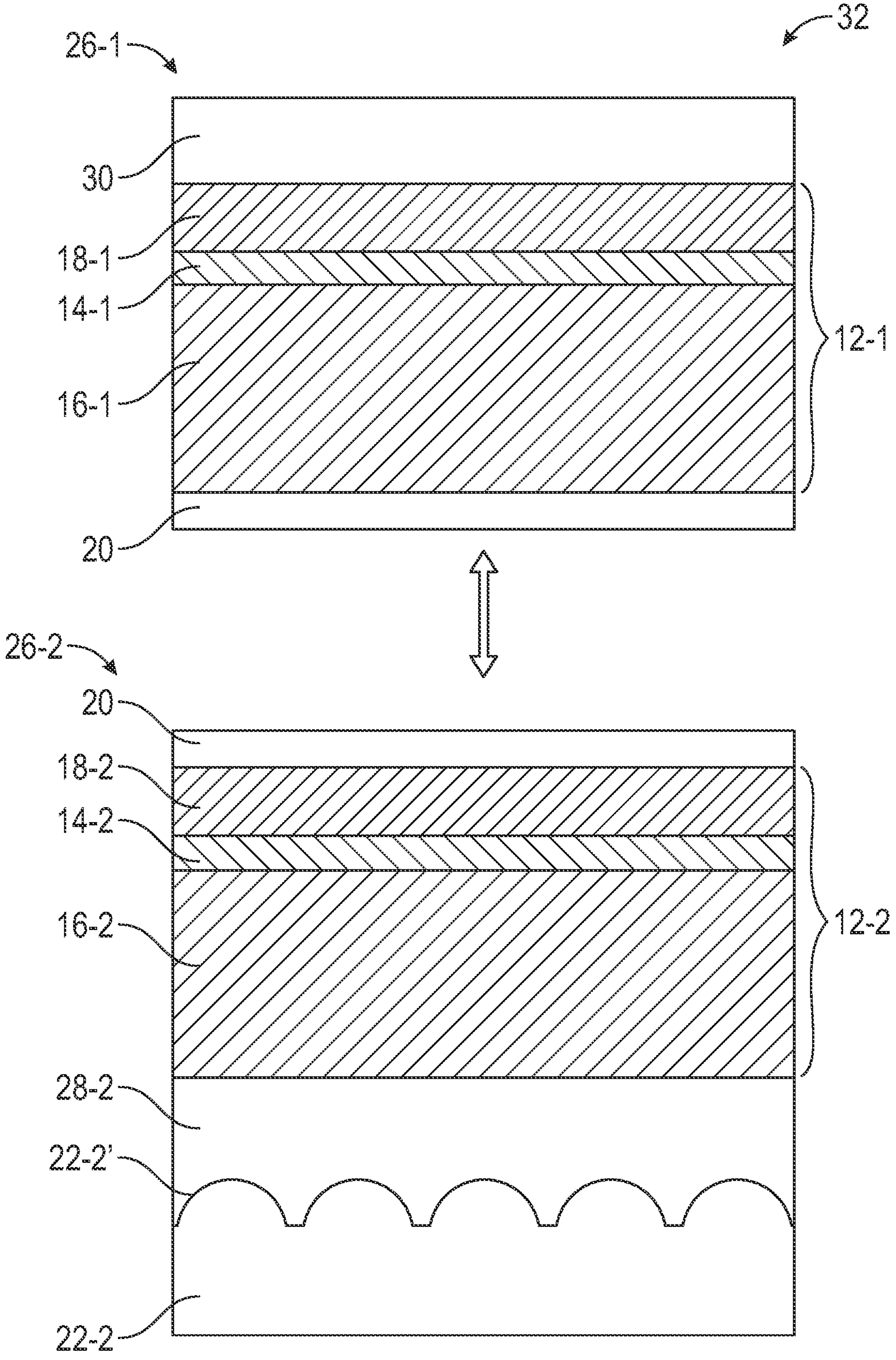
FIG. 2D is a cross-sectional view at a fabrication step where the first LED chip of FIG. 2C is positioned for bonding to a second LED chip to form an LED chip having multiple stacked junctions.

FIG. 2D is a cross-sectional view at a fabrication step where the first LED chip 26-1 of FIG. 2C is positioned for bonding to a second LED chip 26-2 to form an LED chip 32 having multiple stacked junctions. For illustrative purposes, the second LED chip 26-2 is illustrated as similar to the first LED chip 26-1 at the fabrication sequence illustrated in FIG. 2A. That is, a second growth substrate 22-2 is not removed. As described above, specific structures of the first and second LED chips 26-1, 26-2 do not have to be the same and the principles described readily allow different LED structures to be bonded together. The bonding layer 24 as described above for FIG. 1 is positioned between the first and second LED chips 26-1, 26-2. The bonding layer 24 may be initially formed on the first LED chip 26-1 or the second LED chip 26-2, or the bonding layer 24 may be formed on both.

Figure 2E:
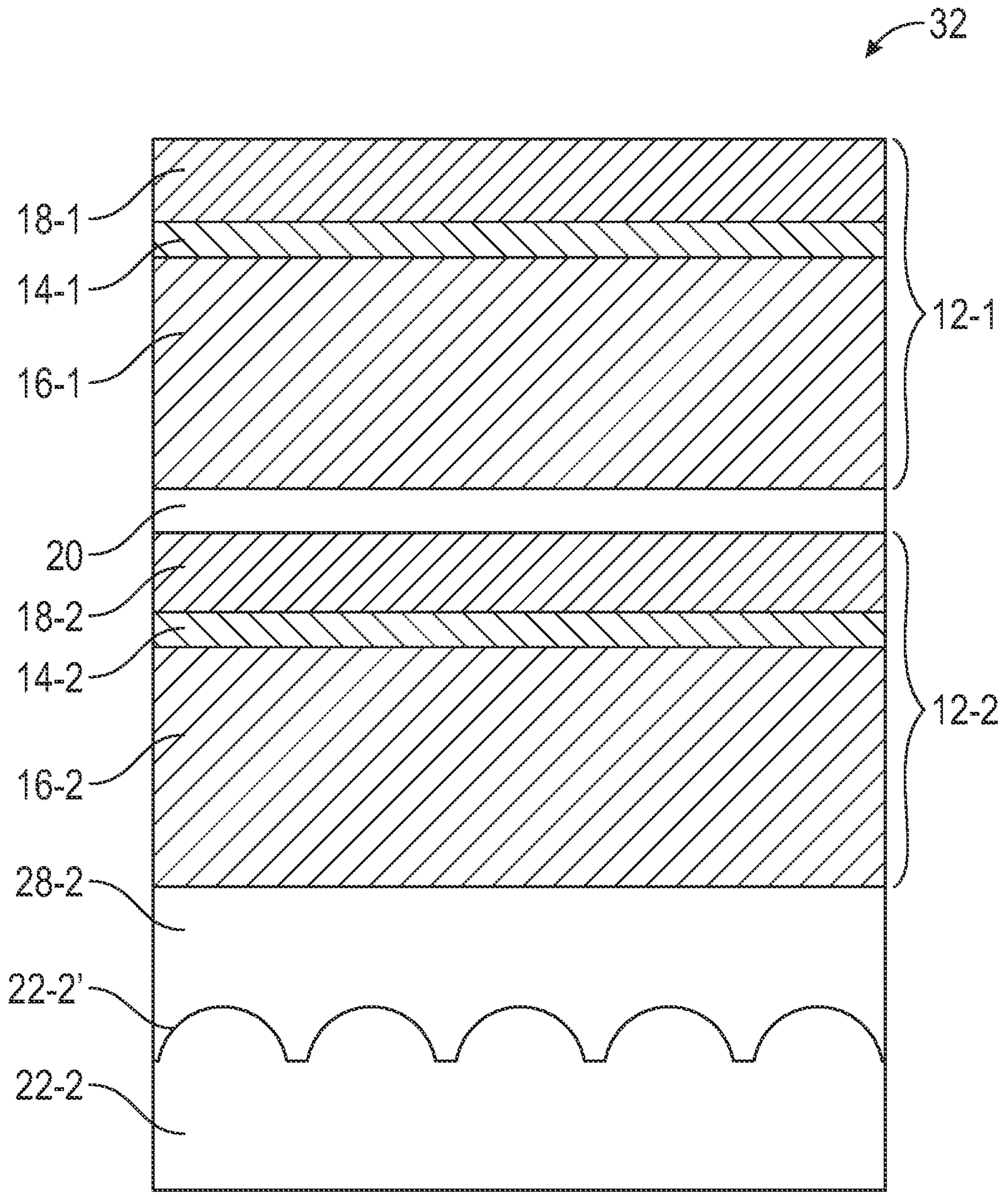
FIG. 2E is a cross-sectional view of the LED chip of FIG. 2D at a fabrication step after the first and second active LED structures are bonded together.

FIG. 2E is a cross-sectional view of the LED chip 32 at a fabrication step after the first and second active LED structures 12-1, 12-2 are bonded together. As illustrated, the carrier substrate 30 of FIGS. 2C and 2D may be removed once the first active LED structure 12-1 is mechanically supported by the second active LED structure 12-2 and corresponding second substrate 22-2. For embodiments with more than two active LED structures, the sequence of FIGS. 2A to 2D may be repeated to sequentially stack additional active LED structures vertically on the first active LED structure 12-1.

Figure 3A:
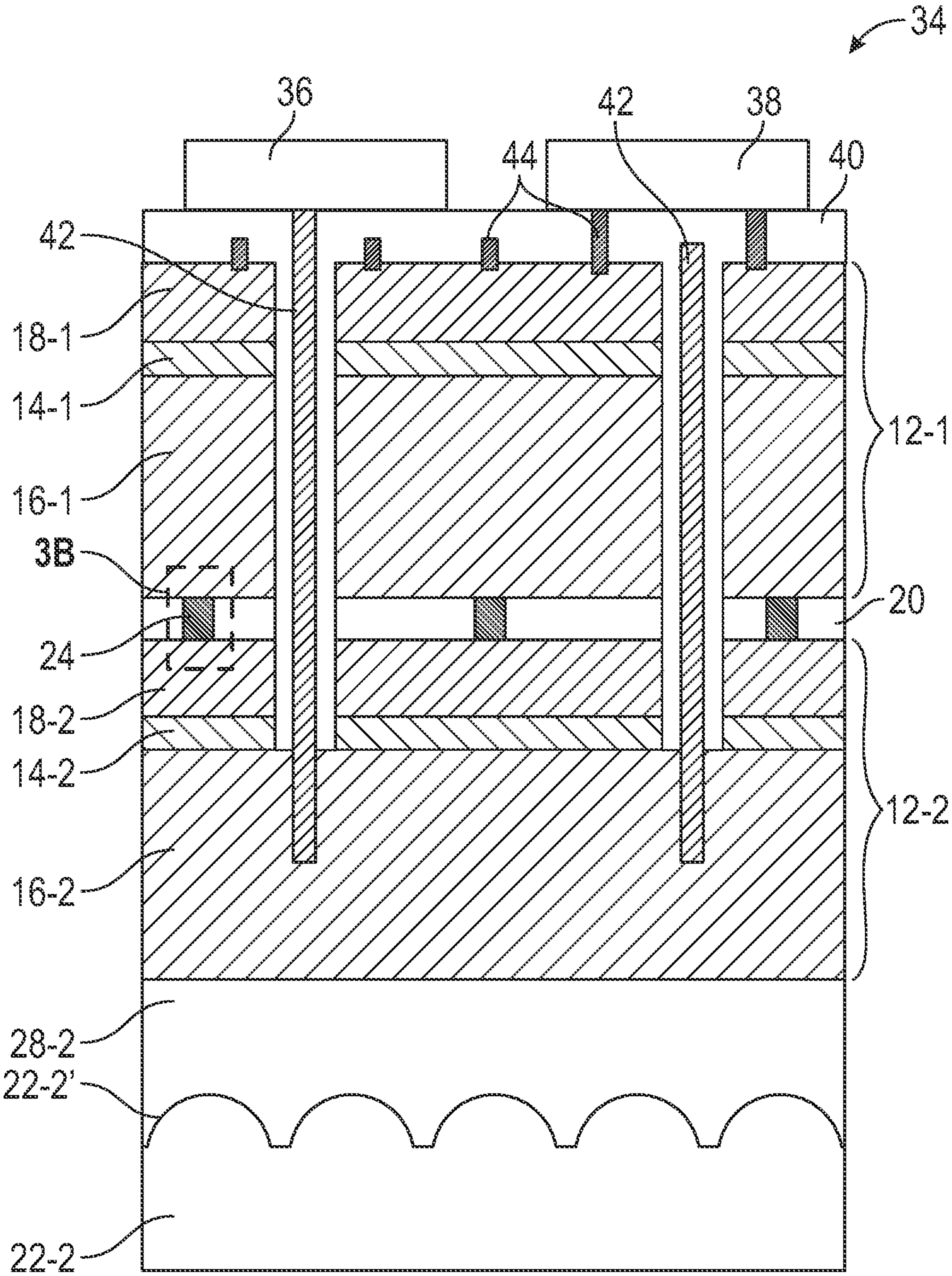
FIG. 3A is a cross-sectional view of an LED chip that is similar to the LED chip of FIG. 2E for a flip-chip structure.

FIG. 3A is a cross-sectional view of an LED chip 34 that is similar to the LED chip 32 of FIG. 2E for a flip-chip structure. The LED chip 34 includes an n-contact 36, or n-contact pad, and a p-contact 38, or p-contact pad, arranged on a same side of the LED chip 34. By way of example, the n-contact 36 and the p-contact 38 are positioned on the first active LED structure 12-1 on a side that is opposite the second active LED structure 12-2 and the substrate 22-2. In this regard, the LED chip 34 may be inverted for flip-chip mounting where the n-contact 36 and the p-contact 38 form mounting pads that are mounted to electrical connections of another surface, such as traces of a printed circuit board. In this flip-chip arrangement, emissions from the active LED structures 12-1, 12-2 primarily exit through the substrate 22-2. A passivation layer 40 may be provided between the first p-type layer 18-1 and the n-contact 36 and the p-contact 38.

Electrical connections between the n-contact 36 and one or more of the n-type layers 16-1, 16-2 may be provided by one or more n-type interconnects 42. The n-type interconnects 42 form electrically conductive paths between the n-contact 36 and at least one of the n-type layers 16-1, 16-2. In FIG. 3A, the n-type interconnects 42 form electrically conductive paths to the second n-type layer 16-2 for facilitating connections to the active LED structures 12-1, 12-2 in series. The n-type interconnect 42 illustrated on the left side of FIG. 3A is positioned beneath the n-contact 36 while the n-type interconnect 42 on the ride side of FIG. 3A is laterally spaced from the n-contact 36. While not visible in the cross-sectional view, it is appreciated that the n-type interconnect 42 on the ride side of FIG. 3A is electrically coupled to the n-contact 36 by way of an electrically conductive path that is out of the plane of view in FIG. 3A. For example, an electrically conductive metal may be located within the passivation layer 40 that laterally connects the n-type interconnects 42 together. In a similar manner, p-type interconnects 44 may be arranged through the passivation layer 40 to electrically connect the first p-type layer 18-1 with the p-contact 38. The p-type interconnects 44 that are laterally spaced from the p-contact 38 may be electrically coupled by way of lateral electrically conductive paths within the passivation layer 40 that are out of the plane of view. As illustrated in FIG. 3A, the n-contact 36 is electrically connected with the second n-type layer 16-2, the p-contact 38 is electrically connected with the first p-type layer 18-1, and the second p-type layer 18-2 is electrically connected with the first n-type layer 16-1 by way of the electrically conductive vias 24. In this manner, the active LED structures 12-1, 12-2 are electrically coupled in series.

Figure 3B:
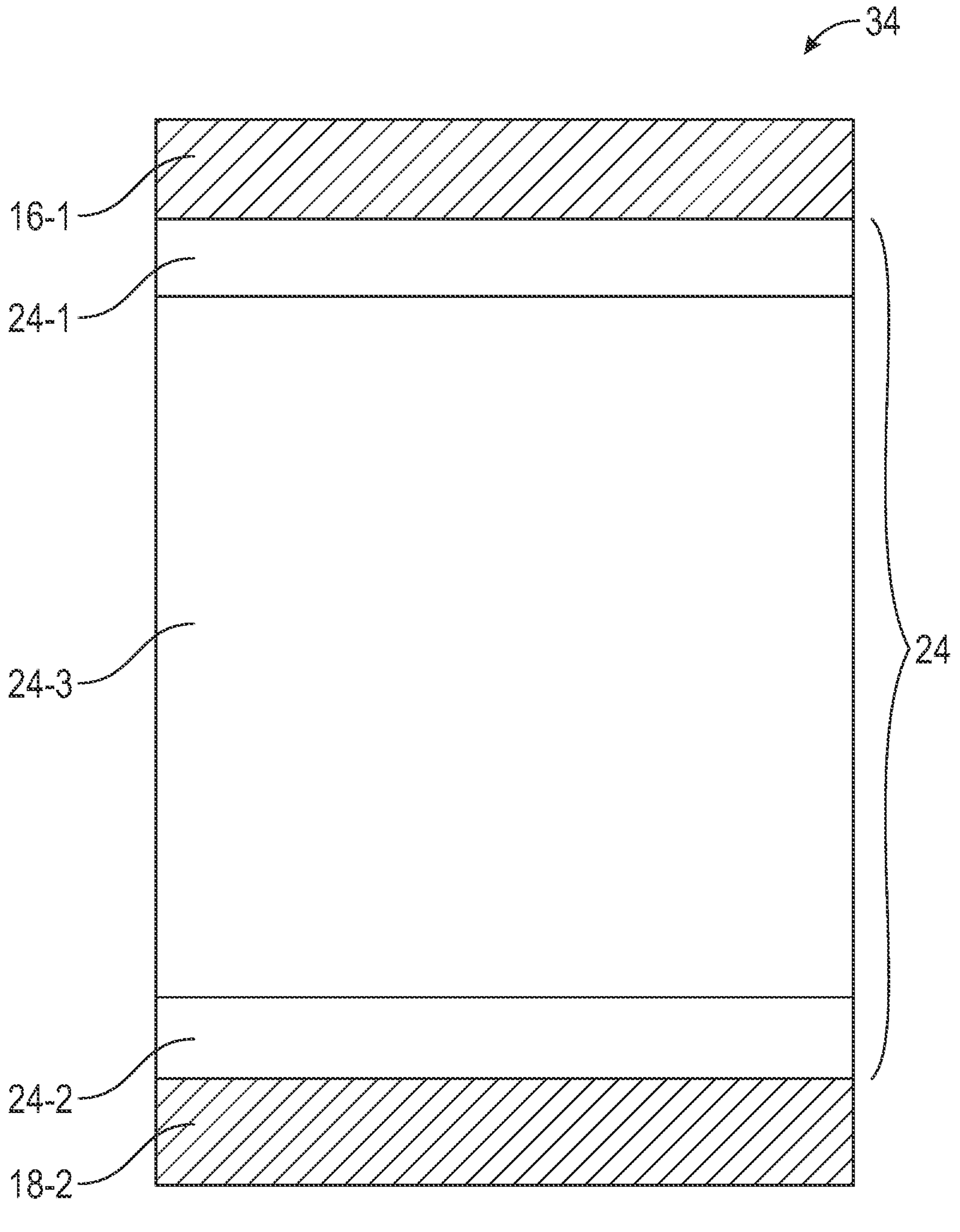
FIG. 3B is a cross-sectional view of a portion of the LED chip of FIG. 3A that includes one of the electrically conductive vias as indicated by the superimposed dashed-line box labeled 3B in FIG. 3A.

FIG. 3B is a cross-sectional view of a portion of the LED chip 34 of FIG. 3A that includes one of the electrically conductive vias 24 as indicated by the superimposed dashed-line box labeled 3B in FIG. 3A. In certain embodiments, the electrically conductive via 24 may comprise a multiple layer structure to allow improved ohmic contacts with different epitaxial types. As illustrated, the same electrically conductive via 24 makes contact with the first n-type layer 16-1 and the second p-type layer 18-2. By forming the electrically conductive via 24 as a multiple layer structure, different materials may be used proximate the different epitaxial types for work function matching and ensuring suitable ohmic contact behavior. By way of example, the electrically conductive via 24 may include a first sublayer 24-1, a second sublayer 24-2, and a third sublayer 24-3. The first sublayer 24-1 contacts the first n-type layer 16-1, the second sublayer 24-2 contacts the second p-type layer 18-2, and the third sublayer 24-3 is formed between the first and second sublayers 24-1, 24-2. In this regard, the first sublayer 24-1 may comprise a first metal selected to make an ohmic contact with the first n-type layer 16-1, and the second sublayer 24-2 may comprise a second metal selected to make an ohmic contact with the second p-type layer 18-2. Since the first n-type layer 16-1 and the second p-type layer 18-2 have different dopants and possibly different material compositions, the first and second metals may be different from one another. The third sublayer 24-3 may include a third metal that is different from both the first and second metals since it is not required to make ohmic connections. The third metal may be selected for reduced costs and improved reflectivity as compared with the first and second metals. Additionally, the third metal may be selected to facilitate intermetallic mixing of the first and second metals.

In the context of GaN-based materials for the first n-type layer 16-1 and the second p-type layer 18-2, the first sublayer 24-1 may comprise one or more of chromium (Cr), molybdenum (Mo), Al, titanium (Ti), and ruthenium (Ru) for providing ohmic behavior with the first n-type layer 16-1. The second sublayer 24-2 may comprise one or more of nickel (Ni), Ag, cadmium (Cd), In, and zinc (Zn) for providing ohmic behavior with the second p-type layer 18-2. The third sublayer 24-3 may have a larger thickness than the other sublayers 24-1, 24-2 and may therefore occupy a majority of the electrically conductive via 24 and facilitate electrical conduction therethrough. The third sublayer 24-3 may comprise a different metal than both the first and second sublayers 24-1, 24-2, such as gold tin (AuSn) or tin silver copper alloys, among others. In this manner, the first and second metals may diffuse into portions of the third sublayer 24-3 from opposite sides of the electrically conductive via 24.

Figure 4:
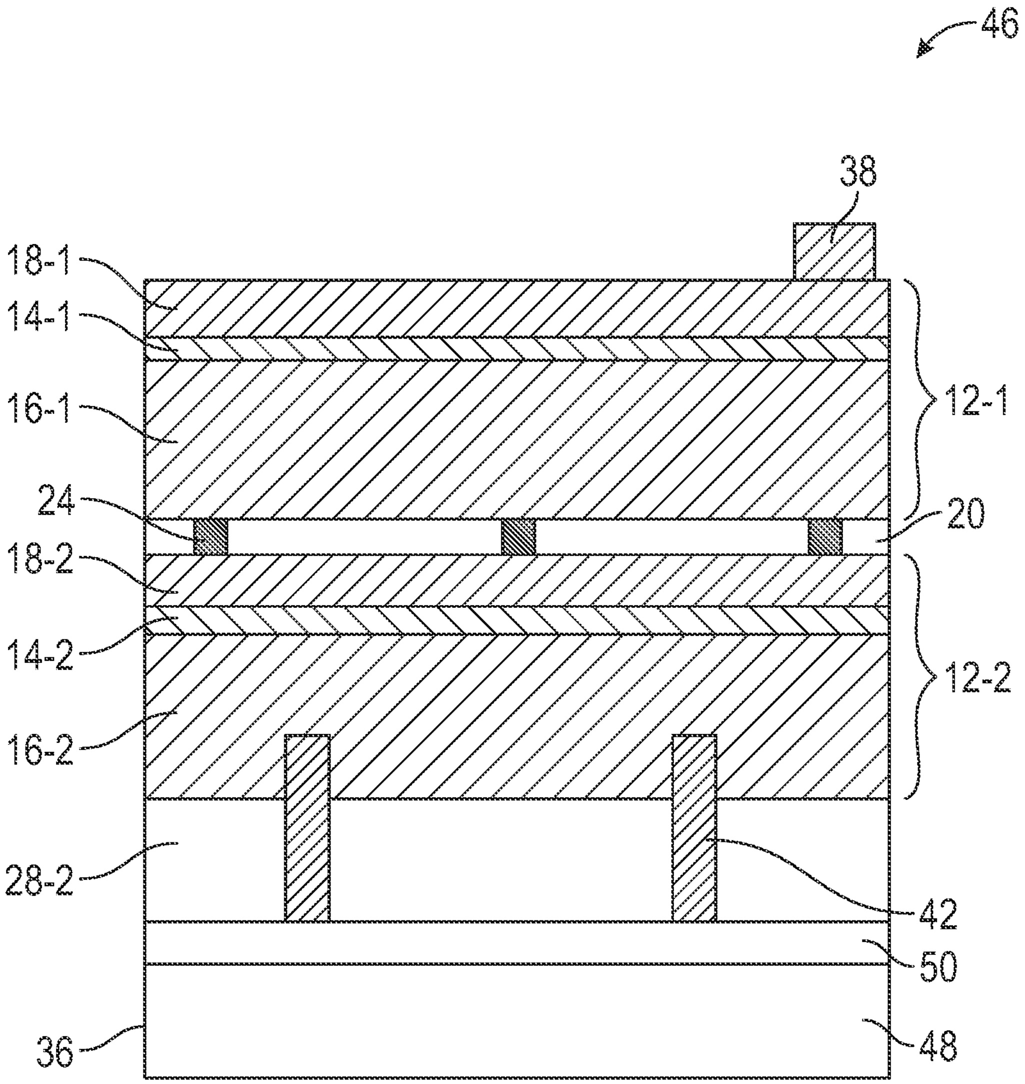
FIG. 4 is a cross-sectional view of an LED chip that is similar to the LED chip of FIG. 2E for a vertical-chip structure.

FIG. 4 is a cross-sectional view of an LED chip 46 that is similar to the LED chip 32 of FIG. 2E for a vertical-chip structure. To facilitate vertical electrical connections, the substrate 22-2 of FIG. 2E is removed and replaced by a conductive substrate 48 on a bottom side of the second active LED structure 12-2. In certain embodiments, one or more metallic bonding layers 50 may facilitate bonding the second active LED structure 12-2 to the conductive substrate 48 while maintaining electrical conductivity. For embodiments where an intermediate layer 28-2 is undoped, one or more of the n-type interconnects 42 may be positioned to form electrically conductive paths to the second n-type layer 16-2. With such a vertical structure, the conductive substrate 48 may form the n-contact 36, or n-contact pad, for the LED chip 46, and the p-contact 38, or p-contact pad, is on a topside of the first p-type layer 18-1. Accordingly, the first and second active LED structures 12-1, 12-2 are arranged between the n-contact 36 and the p-contact 38.

Figure 5:
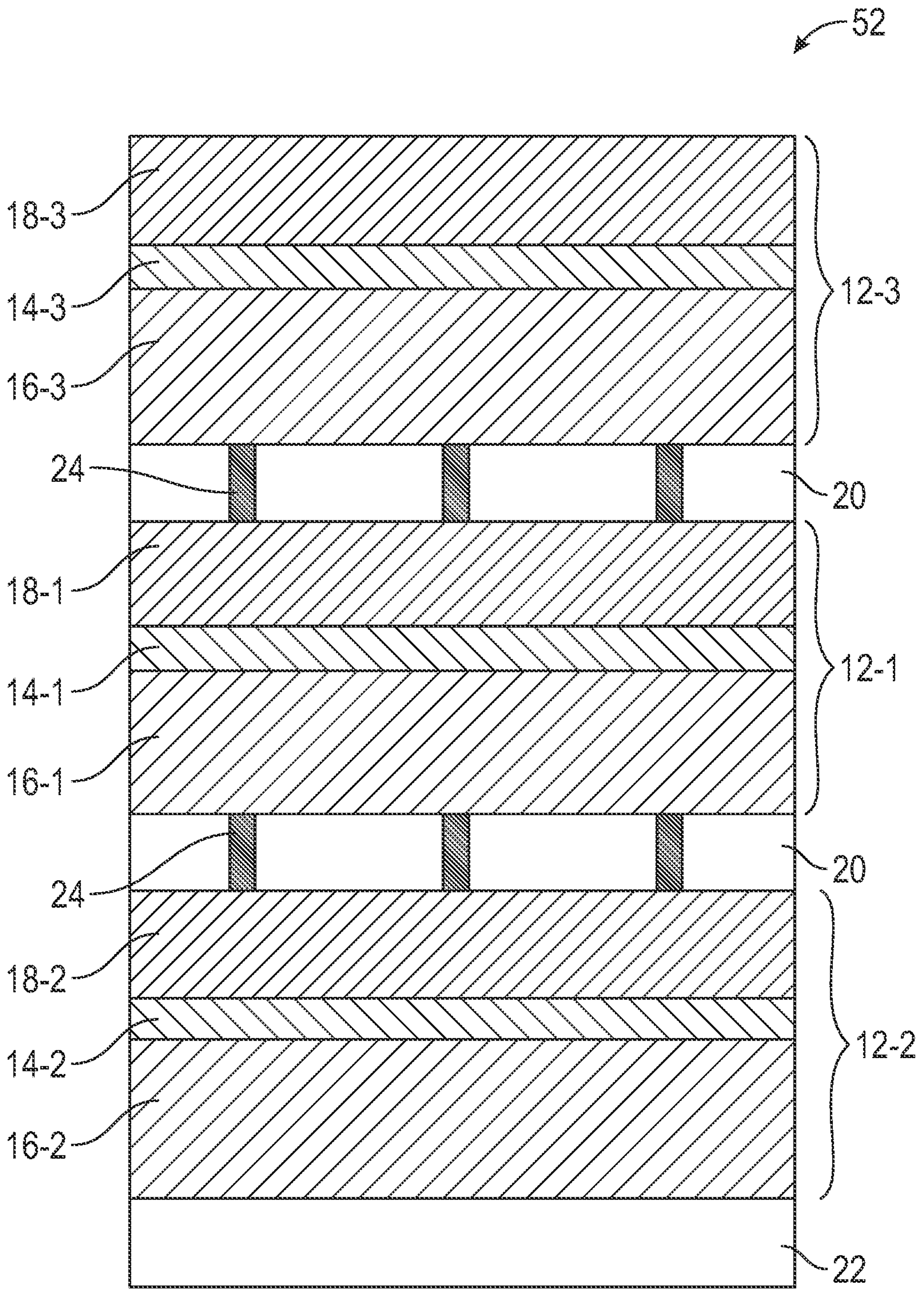
FIG. 5 is a cross-sectional view of an LED chip that is similar to the LED chip of FIG. 1 and further includes a third active LED structure.

FIG. 5 is a cross-sectional view of an LED chip 52 that is similar to the LED chip 10 of FIG. 1 and further includes a third active LED structure 12-3. As described above, any of the previous embodiments may include additional active LED structures to provide various combinations of emission colors, such as red, green, and blue, or incremental peak wavelengths for broadband applications within a same color range. Another bonding layer 20 may be provided between the third active LED structure 12-3 and the first active LED structure 12-1. One or both bonding layers 20 may also have the electrically conductive vias 24. The third active LED structure 12-3 may be provided by repeating the fabrication sequence of FIGS. 2A to 2E. The LED chip 52 may be structured as a flip-chip as described above for FIG. 3A or as a vertical chip as described above for FIG. 4.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) chip, comprising:
a first active LED structure comprising a first n-type layer, a first active layer, and a first p-type layer;
a second active LED structure comprising a second n-type layer, a second active layer, and a second p-type layer;
a bonding layer between the first n-type layer and the second p-type layer, the bonding layer comprising a thickness of at least 100 nanometers (nm);
an n-contact pad; and
at least one n-type interconnect forming an electrically conductive path from the n-contact pad through at least a portion of the second active LED structure to the second n-type layer.

2. The LED chip of claim 1, wherein the bonding layer comprises a thickness in a range from 100 nm to 5000 nm.

3. The LED chip of claim 1, wherein the bonding layer comprises an electrically insulating material and at least one electrically conductive via, the at least one electrically conductive via forming an electrically conductive path between the first n-type layer and the second p-type layer.

4. The LED chip of claim 3, wherein the at least one electrically conductive via comprises:
a first sublayer with a first metal that contacts the first n-type layer; and
a second sublayer with a second metal that contacts the second p-type layer, wherein the second metal is different than the first metal.

5. The LED chip of claim 4, wherein the at least one electrically conductive via further comprises a third sublayer between the first sublayer and the second sublayer, and the third sublayer comprises a third metal that is different from both the first metal and the second metal.

6. The LED chip of claim 1, wherein the bonding layer comprises a conductive oxide.

7. The LED chip of claim 1, further comprising a p-contact pad on a same side of the first active LED structure as the n-contact pad.

8. The LED chip of claim 1, further comprising a p-contact pad, wherein the first active LED structure and the second active LED structure are between the n-contact pad and the p-contact pad.

9. The LED chip of claim 1, wherein the first active LED structure and the second active LED structure are configured to provide peak wavelengths that differ in a range from 5 nanometers (nm) to 20 nm from one another.

10. The LED chip of claim 1, wherein the first active LED structure and the second active LED structure are configured to provide peak wavelengths that differ in a range from 25 nm to 300 nm from one another.

11. The LED chip of claim 1, wherein the n-contact pad is on the first active LED structure and the at least one n-type interconnect forms the electrically conductive path from the n-contact pad through the first active LED structure to the second n-type layer.

12. A light-emitting diode (LED) chip, comprising:

a first active LED structure comprising a first n-type layer, a first active layer, and a first p-type layer;

a second active LED structure comprising a second n-type layer, a second active layer, and a second p-type layer; and a first bonding layer between the first n-type layer and the second p-type layer, the first bonding layer comprising at least one electrically conductive via between the first n-type layer and the second p-type layer, the at least one electrically conductive via comprising a first sublayer with a first metal contacting the first n-type layer, a second sublayer with a second metal contacting the second p-type layer, and a third sublayer between the first sublayer and the second sublayer, the third sublayer comprising a third metal, wherein the second metal is different than the first metal and the third metal is different from both the first metal and the second metal.

13. The LED chip of claim 12, further comprising:

a third active LED structure on the first active LED structure, the third active LED structure comprising a third n-type layer, a third active layer, and a third p-type layer; and a second bonding layer between the third n-type layer and the first p-type layer.

14. The LED chip of claim 13, wherein the second bonding layer comprises another electrically conductive via between the third n-type layer and the first p-type layer.

15. A method, comprising:

providing a first active light-emitting diode (LED) structure comprising a first n-type layer, a first active layer, and a first p-type layer;

providing a second active LED structure comprising a second n-type layer, a second active layer, and a second p-type layer;

bonding the first active LED structure to the second active LED structure with a bonding layer between the first n-type layer and the second p-type layer, the bonding layer comprising a thickness of at least 100 nanometers (nm); and forming an n-contact pad and at least one n-type interconnect, the at least one n-type interconnect forming an electrically conductive path from the n-contact pad through at least a portion of the second active LED structure to the second n-type layer.

16. The method of claim 15, further comprising at least one electrically conductive via in the bonding layer that forms an electrically conductive path between the first n-type layer and the second p-type layer.

17. The method of claim 15, wherein the first active LED structure is formed on a first growth substrate and the second active LED structure is formed on a second growth substrate.

18. The method of claim 17, further comprising removing the first growth substrate from the first active LED structure before bonding the first active LED structure to the second active LED structure.

19. The method of claim 15, further comprising bonding a third active LED structure to the first active LED structure.

20. The method of claim 15, wherein the n-contact pad is on the first active LED structure and the at least one n-type interconnect forms the electrically conductive path from the n-contact pad through the first active LED structure to the second n-type layer.

* * * * *